(12) United States Patent
Kurita et al.

(10) Patent No.: US 10,373,809 B2
(45) Date of Patent: Aug. 6, 2019

(54) GROOVED BACKING PLATE FOR STANDING WAVE COMPENSATION

(71) Applicant: Applied Materials, Inc., Santa Clara, CA (US)

(72) Inventors: Shinichi Kurita, San Jose, CA (US); Robin L. Tiner, Santa Cruz, CA (US)

(73) Assignee: APPLIED MATERIALS INC., Santa Clara, CA (US)

( * ) Notice: Subject to any disclaimer, the term of this patent is extended or adjusted under 35 U.S.C. 154(b) by 278 days.

(21) Appl. No.: 15/274,608

(22) Filed: Sep. 23, 2016

(65) Prior Publication Data

US 2017/0092469 A1    Mar. 30, 2017

Related U.S. Application Data

(60) Provisional application No. 62/232,825, filed on Sep. 25, 2015.

(51) Int. Cl.
| | | |
|---|---|---|
| *C23C 16/00* | (2006.01) | |
| *C23F 1/00* | (2006.01) | |
| *H01L 21/306* | (2006.01) | |
| *H01J 37/32* | (2006.01) | |

(Continued)

(52) U.S. Cl.
CPC ...... *H01J 37/32431* (2013.01); *C23C 16/458* (2013.01); *C23C 16/505* (2013.01); *H01J 37/321* (2013.01); *H01J 37/32091* (2013.01); *H01J 37/32174* (2013.01); *H01J 37/32183* (2013.01); *H01J 37/32568* (2013.01); *H01J 2237/3321* (2013.01)

(58) Field of Classification Search
USPC ...... 118/723 E, 723 ER; 156/345.43–345.47; 315/111.21
See application file for complete search history.

(56) References Cited

U.S. PATENT DOCUMENTS

| | | | |
|---|---|---|---|
| 5,876,573 | A | 3/1999 | Moslehi et al. |
| 7,687,117 | B2 | 3/2010 | Schmitt et al. |
| 2002/0068516 | A1 | 6/2002 | Chen et al. |

(Continued)

FOREIGN PATENT DOCUMENTS

| | | |
|---|---|---|
| JP | 2012241239 A | 12/2012 |
| WO | 2014039251 A1 | 3/2014 |

OTHER PUBLICATIONS

International Search Report and Written Opinion for International Application No. PCT/US2016/053399 dated Dec. 8, 2016.

*Primary Examiner* — Rakesh K Dhingra
(74) *Attorney, Agent, or Firm* — Patterson + Sheridan LLP

(57) ABSTRACT

Implementations described herein generally relate to components and methods used in plasma processing, and more specifically relate to grooved surfaces for controlling RF return path lengths in plasma processing chambers and methods for forming the same. In one implementation, a backing plate for a plasma processing chamber is provided. The backing plate comprises a rectangular body. The rectangular body has a front surface, a back surface opposing the front surface, a first axis perpendicular to a center of the rectangular body and a plurality of grooves formed in the front surface. At least one groove of the plurality of grooves has a first length across the groove in a first location and a second length across the groove in a second location.

20 Claims, 5 Drawing Sheets

(51) Int. Cl.
*C23C 16/458* (2006.01)
*C23C 16/505* (2006.01)

(56) References Cited

U.S. PATENT DOCUMENTS

| | | |
|---|---|---|
| 2005/0279628 A1 | 12/2005 | Vukovic |
| 2009/0090620 A1 | 4/2009 | Pavloff |
| 2009/0197015 A1 | 8/2009 | Kudela et al. |
| 2010/0139562 A1* | 6/2010 | Kang ................ C23C 16/5096 118/723 E |
| 2012/0199469 A1 | 8/2012 | Rasheed et al. |
| 2013/0256127 A1* | 10/2013 | Young ................ C23C 14/35 204/298.08 |
| 2014/0174361 A1 | 6/2014 | Chen et al. |

* cited by examiner

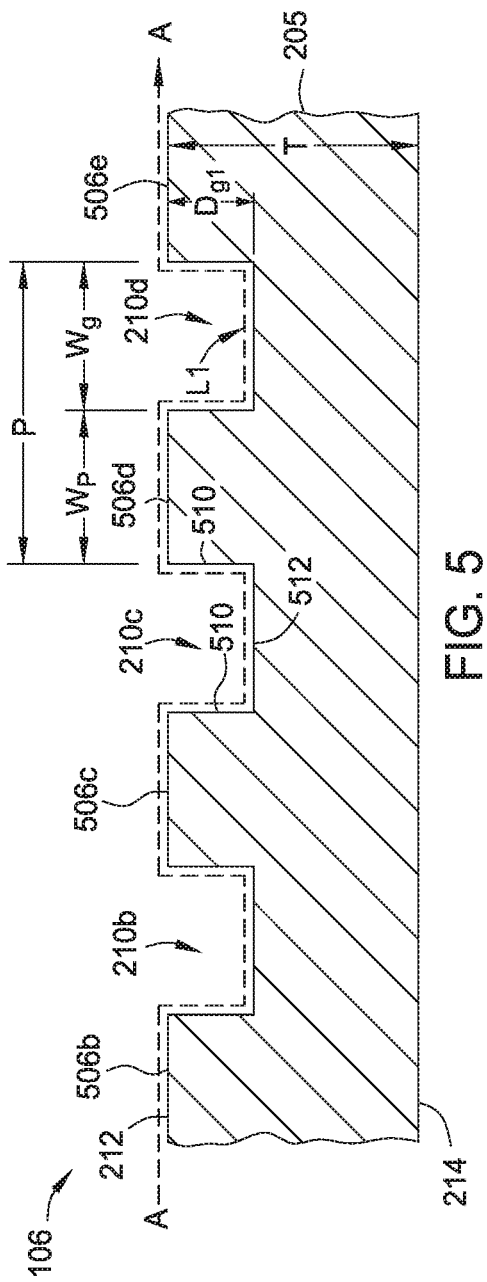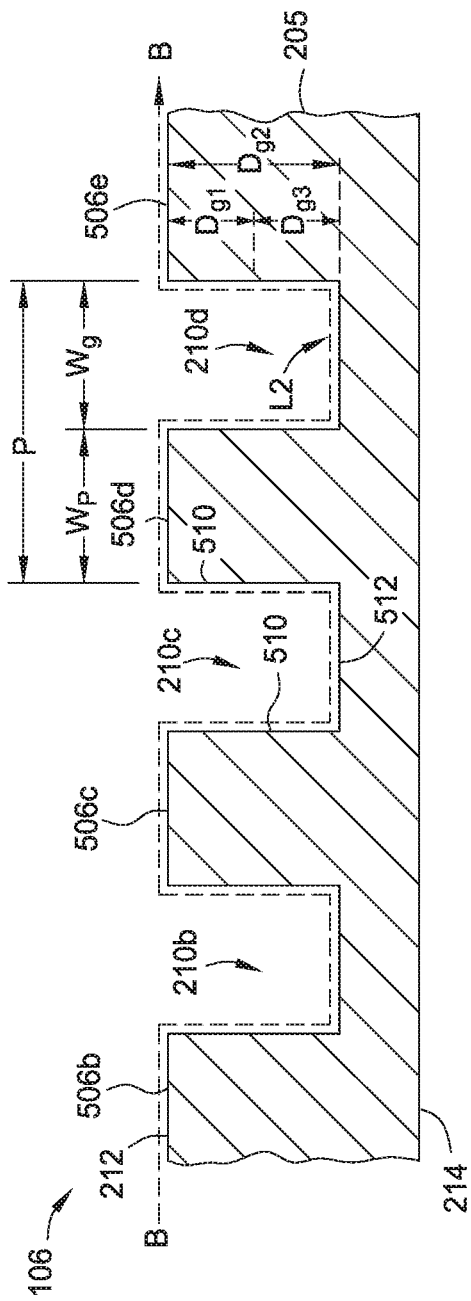

GROOVED BACKING PLATE FOR STANDING WAVE COMPENSATION

CROSS-REFERENCE TO RELATED APPLICATIONS

This application claims benefit of U.S. provisional patent application Ser. No. 62/232,825, filed Sep. 25, 2015. The aforementioned priority patent application is herein incorporated by reference in its entirety.

BACKGROUND

Field

Implementations described herein generally relate to components and methods used in plasma processing of substrates, and more specifically relate to grooved surfaces for controlling RF return path lengths in plasma processing chambers and methods for forming the same.

Description of the Related Art

Plasma enhanced chemical vapor deposition (PECVD) is generally employed to deposit thin films on substrates, such as organic light emitting diode (OLED) substrates and semiconductor substrates. PECVD is generally accomplished by introducing a precursor gas into a vacuum chamber having a substrate disposed on a substrate support. The precursor gas is typically directed through a gas distribution showerhead situated near the top of the vacuum chamber. The precursor gas in the vacuum chamber is excited into a plasma by applying a radio frequency ("RF") power to a chamber electrode from one or more RF sources coupled to the chamber. The plasma forms a layer of material on a surface of a substrate that is positioned on a substrate support. The gas distribution showerhead is generally connected to an RF power source and the substrate support is typically connected to the chamber body to create an RF power return path.

The standard frequency of the RF generators mostly used in the industry is 13.56 MHz. However, lower and higher frequencies have been considered for plasma applications. For example, for PECVD applications, there is a trend to shift the RF frequency to values higher than 13.56 MHz, the preferred values being 27.12 MHz and 40.68 MHz (harmonics of 13.56 MHz). Higher frequencies allow for higher deposition rates in PECVD processes and thus increase productivity and lower production costs.

With large area plasma processing equipment, problems with plasma processing uniformity may arise when the RF frequency is higher than 13.56 MHz and a large size (large surface) substrate is used. The problem may be exacerbated when the largest dimension of the plasma reactor (the diagonal) is equal or larger than the free space wavelength of the RF electric power driving the plasma. Under such circumstances, the reactor size is no longer negligible relative to the free space wavelength of the RF electromagnetic wave. In such a case, the plasma intensity along the reactor is no longer uniform. Physically, the origin of such a limitation lies in the fact that the RF wave is distributed according to the beginning of a "standing wave" spatial oscillation within the reactor.

Thus, there is a need for components and methods for standing wave compensation that provide improved plasma processing uniformity.

SUMMARY

Implementations described herein generally relate to components and methods used in plasma processing, and more specifically relate to grooved surfaces for controlling RF return path lengths in plasma processing chambers and methods for forming the same. In one implementation, a backing plate for a plasma processing chamber is provided. The backing plate comprises a rectangular body. The rectangular body has a front surface, a back surface opposing the front surface, a first axis perpendicular to a center of the rectangular body and a plurality of grooves formed in the front surface. At least one groove of the plurality of grooves has a first length across the groove in a first location and a second length across the groove in a second location.

In another implementation, a backing plate for a plasma processing chamber is provided. The backing plate comprises a rectangular body. The rectangular body has a front surface, a back surface opposing the front surface, a first axis perpendicular to a center of the rectangular body and a plurality of circular grooves formed in the front spaced apart from each other. The backing plate further comprises a first RF return path orthogonal to the first axis and extending across the front surface of the rectangular body from the first axis to a corner of the rectangular body. The backing plate further comprises a second RF return path orthogonal to the first axis and extending across the front surface of the rectangular body from the first axis to a midpoint of an edge of the rectangular body. Each groove of the plurality of circular grooves has a first groove profile defined along the first RF return path that is different from a second groove profile defined along the second RF return path. The second groove profile is larger than the first groove profile such that a length of the front surface defined along the first RF return path is equal to or substantially equal to a length defined along the second RF return path.

In yet another implementation, a plasma processing chamber is provided. The chamber comprises a chamber body, a substrate support disposed in the chamber body, a radio frequency (RF) power source operable to provide power to generate a plasma within the chamber body and a RF return path defined between the substrate support and the RF power source. The RF return path comprises a plurality of circular grooves formed in a surface of the RF return path, wherein at least one groove of the plurality of circular grooves circumscribes a connection between the RF return path and the RF power source, the groove having a non-uniform profile.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 5 is an enlarged cross-sectional view of a portion of the backing plate taken along line 5-5 of FIG. 4; and FIG. 6 is an enlarged cross-sectional view of a portion of the backing plate taken along line 6-6 of FIG. 4.

Figure 1:
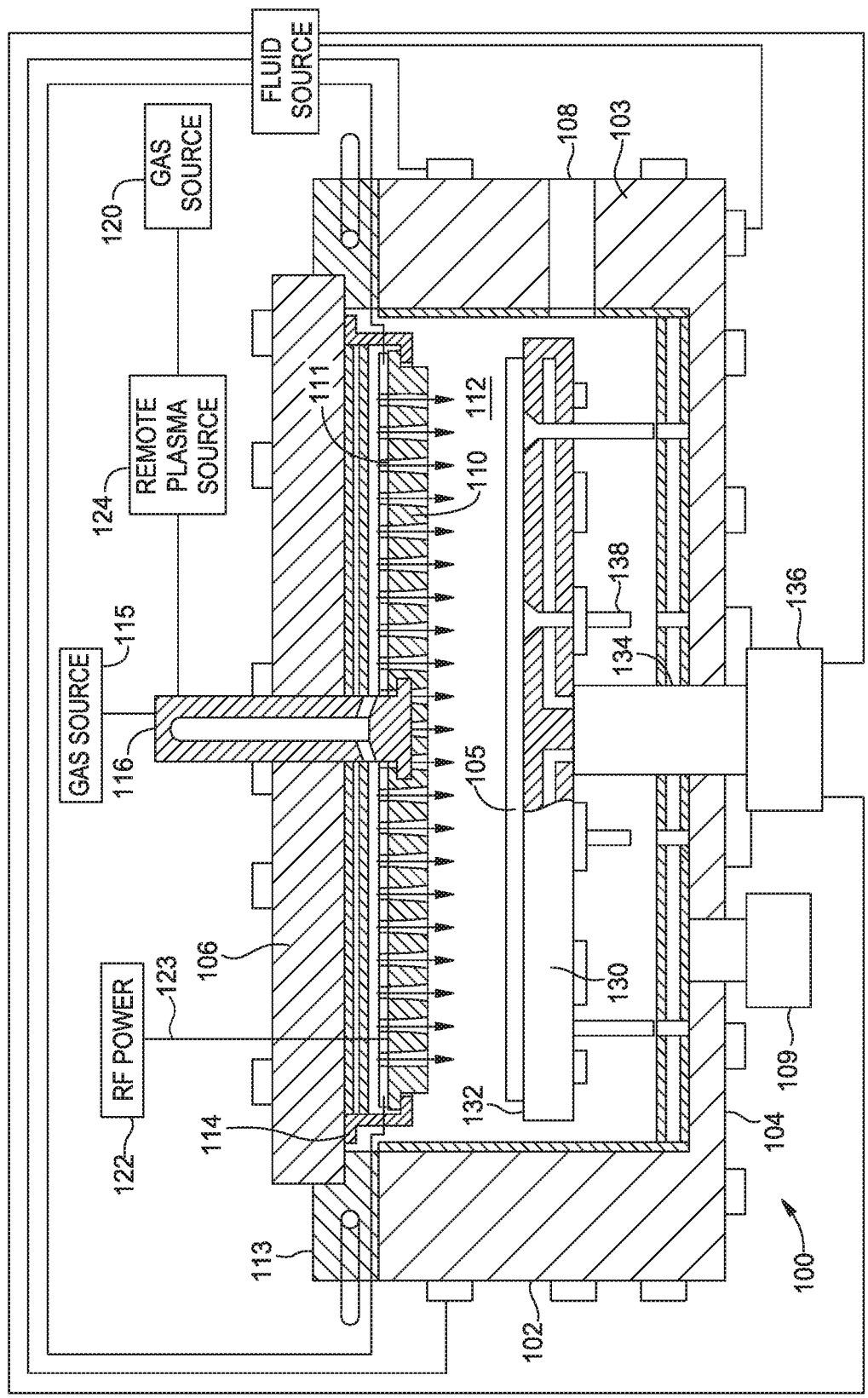
FIG. 1 is a schematic cross-section view of one implementation of a PECVD chamber with a backing plate according to implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes components and methods used in plasma vapor deposition to compensate for the standing wave effect. Certain details are set forth in the following description and in FIGS. 1-6 to provide a thorough understanding of various implementations of the disclosure. Other details describing well-known structures and systems often associated with plasma vapor deposition and standing wave effect compensation are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD chamber available from AKT America, Inc., a subsidiary of Applied Materials, Inc., Santa Clara, Calif. Other processing chamber suitable for plasma processing of substrate may also be adapted to benefit from the implementations described herein. Such processing chamber may include, but are not limited to, physical vapor deposition chambers, etch chambers, ion implant chambers, and plasma treatment chambers, among others. In addition, other systems utilizing plasma processing may benefit from utilizing the grooved technique described herein to control the length of the RF return path in order to tune the uniformity of the plasma. The deposition apparatus description described herein is illustrative and should not be construed or interpreted as limiting the scope of the implementations described herein.

Flat panel displays (FPDS) are typically made by sandwiching liquid crystals between two glass substrates. One substrate is a color filter and the other substrate contains an array of thin film transistors (TFTs), and is therefore, referred to as the TFT array substrate. The thin films of the TFT array substrate are deposited using a plasma process. As the demand for larger and larger displays continues, the area of the substrate has been increased from one square meter to over two square meters. The thin films may be deposited by PECVD. The challenge arises because it is difficult to create and sustain a uniform plasma density over such a large area. Without a uniform plasma density, film properties such as refractive index, wet etch rate, stress, atomic ratio, percentage of hydrogen bonding and thickness are also non-uniform across the panel (also referred to as a substrate). The performance capabilities of the TFTs are directly impacted by non-uniform film properties or sub-standard film properties.

Thin films for flat panel displays, organic light emitting diode (OLED) substrates and semiconductor substrates are typically processed using PECVD. PECVD entails introducing a precursor gas or gas mixture into a vacuum chamber that contains a substrate. The precursor gas or gas mixture is typically directed downward through a distribution plate situated near the top of the chamber. The precursor gas or gas mixture in the chamber is energized (e.g., excited) into a plasma by applying RF power to the chamber from one or more RF sources coupled to the chamber. The excited gas or gas mixture reacts to form a layer of material on a surface of the substrate that is positioned on a temperature-controlled substrate support assembly. Volatile by-products produced during the reaction are pumped from the chamber through an exhaust system.

As the sizes of substrates increase, maintaining uniform film thickness and film properties for large area PECVD becomes an issue. The difference of deposition rate and/or film properties between the center and the edge of the substrate becomes significant due to non-uniform plasma density in the processing chamber.

In M. A. Lieberman's study of the source of the plasma density, Lieberman found that the standing wave effect (SWE), edge effects and skin effects are significant factors for plasma density uniformity. Further details of Lieberman's findings can be found in M. A. Lieberman et al., "Standing wave and skin effects in large-area, high-frequency capacitive discharges," Plasma Sources Sci. Technol., Vol. 11, pp. 283-292 (2002), and M. A. Lieberman, Principles of Plasma Discharges and Materials Processing, Wiley-Interscience, New York (1994).

For substrates, less than two square meters in area, edge effects and skin effects may be negligible. Therefore, in these instances, the most significant of Lieberman's factors is SWE. SWE manifests itself most clearly as a dome or increase in film thickness at the center of the substrate. SWE becomes significant as substrate or electrode size approaches the RF wavelength ($\lambda_0$). A typical RF frequency used is 13.56 MHz, which corresponds to a wavelength of 22.11 meters. For SWE to not be an issue, the following should hold true:

$$\lambda_0 >> 2.6(L/s)^{1/2}R$$

where L is the half spacing between electrodes, "s" is the plasma sheath thickness, and R is the radius (or in the case of a rectangular substrate, the half-diagonal dimension of the substrate). Typical values for L and s are 20 millimeters and 1.5 millimeters, respectively. Therefore, for a panel 1100 millimeters×1250 millimeters, the right hand side of the equation is 5.6 meters, which is just at the limit of the comfort zone of being 4 times smaller than the wavelength of approximately 22 meters. Increasing the wavelength by lowering the RF frequency is undesirable because higher plasma potential (as indicated by peak-to-peak voltage) induces ion bombardment, which may damage the substrate and films. For other reasons, such as, but not limited to, increasing the deposition rate, RF frequencies may be increased to as high as 30 MHz. However, increased RF frequency will only exacerbate the SWE. Therefore, at increased RF frequencies, robust solutions to the SWE problem and large substrate problems are needed.

Several attempts and some improvements have been made to address the SWE, and ultimately, the film properties. One strategy seeks to increase the width of the plasma sheath. Widening the sheath can be achieved, for example, by decreasing the spacing between the upper and lower electrodes in a parallel plate processing chamber. In general, narrower electrode spacing reduces the thick center feature of films. However, no single electrode spacing is known to also yield acceptably uniform film properties. Therefore, instead of changing the spacing of the electrodes, the shape of the diffuser may be changed to effectively yield simultaneous different electrode spacing at the edge of the chamber versus the center of the chamber. For example, if the diffuser is shaped to dome-up in the center and push down at the edges, the effective electrode spacing would be wide in the center of the chamber and narrow at the chamber edges. If the electrode spacing is increased by widening it over the substrate, "overall" plasma density is reduced, to such an extent that as the electrical field between the two electrodes is decreased, and deposition thickness is reduced, although SWE still exists. If the electrode spacing is decreased by narrowing it, "overall" plasma density is increased. Accordingly, by increasing electrode spacing in the middle and decreasing it at the corner, plasma uniformity over the plate can be compromised quite uniformly. To counteract the skin effect mentioned by Lieberman, multiple grounding paths and grounding paths asymmetric in both location and conductance are connected to the susceptor (also known as the substrate support assembly).

The SWE concerns that started with substrate sizes greater than one square meter may be ameliorated to some extent by some of the solutions previously discussed; however, for substrates with a plan area greater than one square meter, film and plasma uniformity problems persist despite implementing these proposed solutions.

FIG. 1 is a schematic cross-section view of one implementation of a PECVD chamber 100 with a backing plate 106 for forming electronic devices, such as TFTs and OLEDs, according to implementations described herein. It is noted that the PECVD chamber 100 shown in FIG. 1 is an exemplary apparatus that may be used to form electronic devices on a substrate. One suitable PECVD chamber is available from AKT, Inc., a subsidiary of Applied Materials, Inc., located in Santa Clara, Calif. It is contemplated that other plasma chambers, including those from other manufacturers, may be utilized to practice the present disclosure.

The PECVD chamber 100 generally includes walls 102, a bottom 104, and the backing plate 106. The walls 102, the bottom 104 and the backing plate 106 define a process volume 112. In some implementations, the PECVD chamber 100 includes a lid plate 113 that interfaces with the backing plate 106 and the walls 102. If present, the lid plate 113 forms part of the process volume 112. At least the walls 102, the bottom 104 and the backing plate 106 collectively form a chamber body 103 of the PECVD chamber 100. A gas distribution plate or diffuser 110 and a substrate support 130 are disposed in the process volume 112. The process volume 112 is accessed through a sealable port 108 formed through the walls 102 such that a substrate 105 may be transferred into and out of the PECVD chamber 100. The substrate support 130 includes a substrate receiving surface 132 for supporting the substrate 105. A stem 134 that is coupled to a lift system 136 is utilized to raise and lower the substrate support 130 relative to the diffuser 110. Lift pins 138 are moveably disposed through the substrate support 130 to space the substrate 105 away from the substrate receiving surface 132 when the substrate support 130 is lowered toward the bottom 104 in order to facilitate substrate transfer.

In one implementation, the diffuser 110 is coupled to the backing plate 106 at a periphery of the diffuser 110 by a suspension 114. The diffuser 110 may also be coupled to the backing plate 106 by a center support 116 to help prevent sag and/or control the straightness/curvature of the diffuser 110. A process gas source 115 may be coupled to the center support 116 to provide gases through the backing plate 106 that is distributed through a plurality of passages 111 formed in the diffuser 110. A cleaning gas source 120 may be coupled to the center support 116 to provide gases through the backing plate 106 that is distributed through the plurality of passages 111 formed in the diffuser 110. The gases flow through the diffuser 110 toward the substrate 105 and/or the substrate receiving surface 132 of the substrate support 130. A vacuum pump 109 is coupled to the PECVD chamber 100 to control the pressure within the process volume 112.

In one implementation, a radio frequency (RF) power source 122 is coupled to the backing plate 106 and/or to the diffuser 110 to provide RF power to the diffuser 110. The RF power source 122 is utilized to generate an electric field between the diffuser 110 and the substrate support 130 so that a plasma may be formed when gases present between the diffuser 110 and the substrate support 130. Various RF frequencies may be used, such as a frequency between about 0.3 MHz and about 200 MHz. In one implementation, the RF power source 122 provides power to the diffuser 110 at a frequency of 13.56 MHz. The RF power source 122 is generally coupled to the diffuser 110 by an RF conductor 123, such as a coaxial cable, which allows RF power, delivered to the diffuser 110 to energize the plasma, to return to the RF power source 122 by traveling along the surfaces of the substrate support 130, the chamber body 103 and the backing plate 106 to the ground return conductor of the coaxial cable. In one implementation, RF power returning to the RF power source 122 is routed to the coaxial cable by the center support 116 coupled to the backing plate 106. Thus, the length of RF return path defined along the surfaces of the chamber components comprising the RF return path between the substrate support 130 and the RF conductor 123 coupled to the RF power source 122 may be adjusted by forming one or more grooves, as further discussed below, across the RF return path, where the profile of the groove is not uniform thus allowing the plasma profile to be tailored to a chosen configuration. For example, the profile across one portion of the groove may be different from the profile across another portion of the groove. The profile of the groove may be changed by adjusting the depth, width or other groove geometry.

A remote plasma source 124, such as an inductively coupled remote plasma source, may also be coupled between the cleaning gas source 120 and the backing plate 106. In the implementation shown, the remote plasma source 124 is coupled to the backing plate 106. However, in some implementations, the remote plasma source 124 may be coupled to the walls 102. Between processing substrates, a cleaning gas may be provided to the remote plasma source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases provided by the cleaning gas source 120 include, but are not limited to, nitrogen fluoride ($NF_3$) fluorine gas ($F_2$) and sulfur hexafluoride ($SF_6$).

Process gases in the process gas source 115 may include silicon containing and/or nitrogen containing precursor gases, such as silanes e.g., $SiH_4$ and ammonia ($NH_3$). The process gases are excited into a plasma using the RF power source 122 to deposit silicon nitride (SiN) on the substrate 105. The SiN may be used for forming, as one example, an encapsulation layer on an OLED device on the substrate 105.

Figure 2:
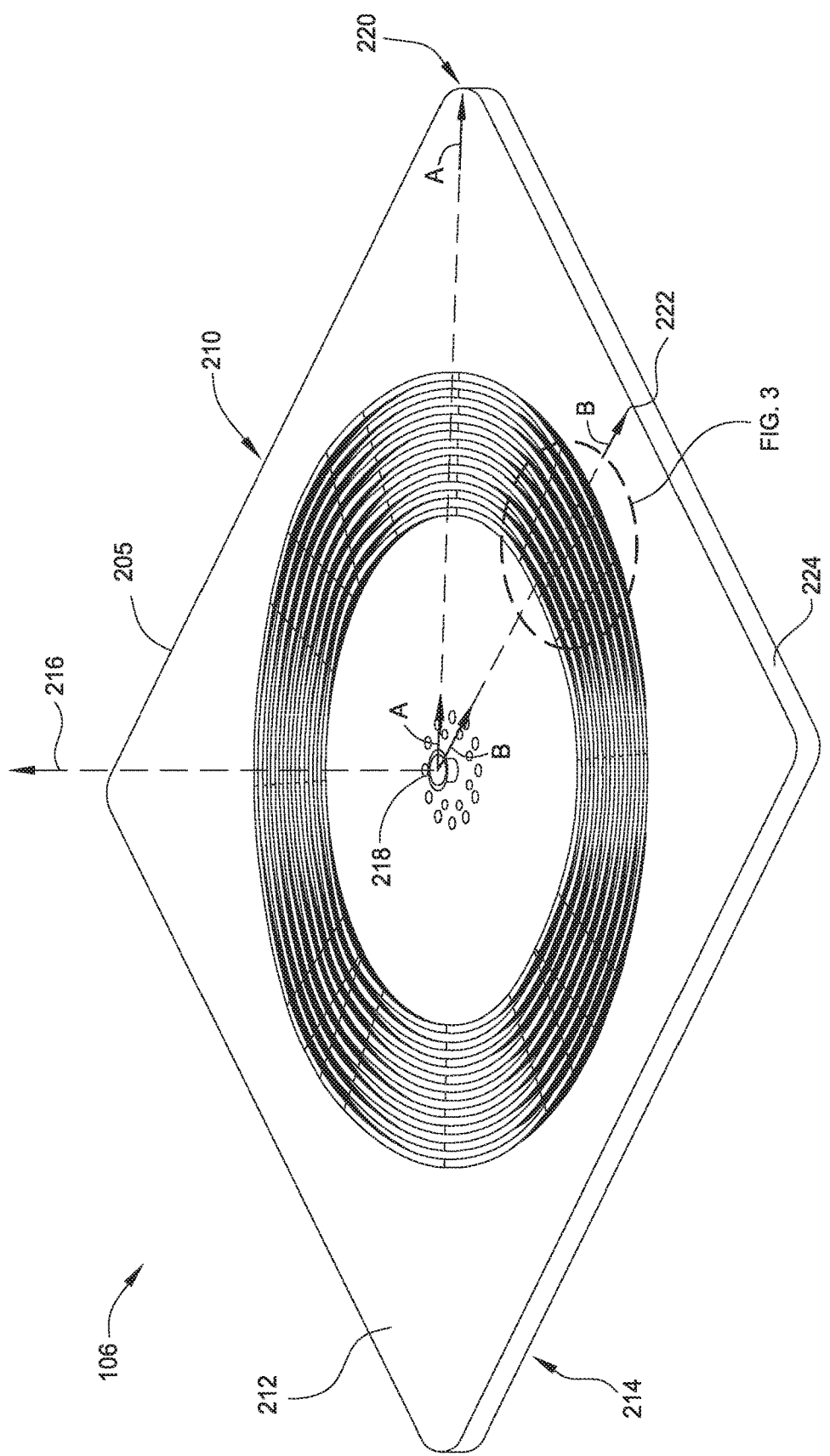
FIG. 2 is a perspective view of the of the backing plate showing a plurality of grooves according to implementations described herein.
Figure 3:
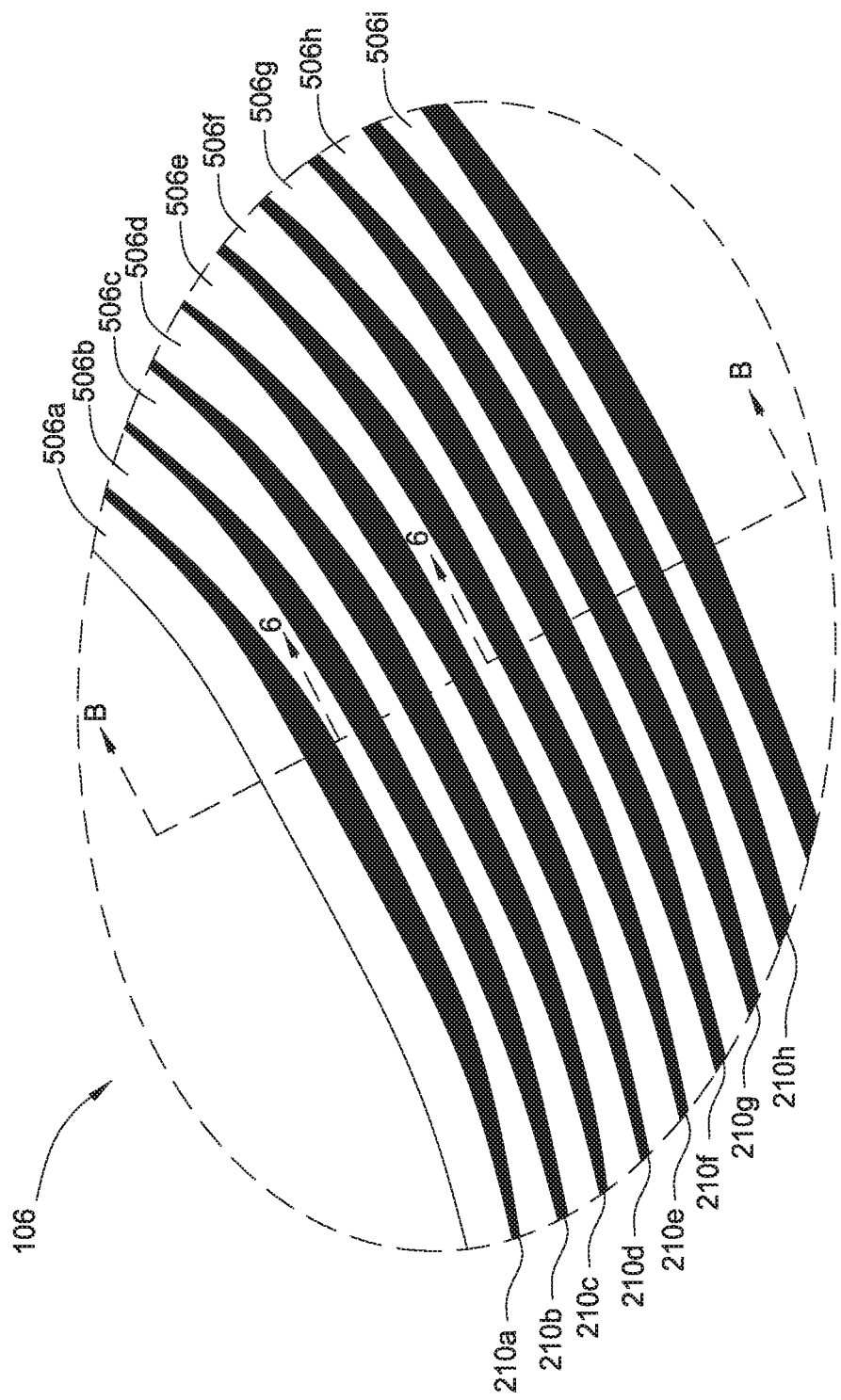
FIG. 3 is an enlarged view of a portion of the backing plate of FIG. 2 according to implementations described herein.
Figure 4:
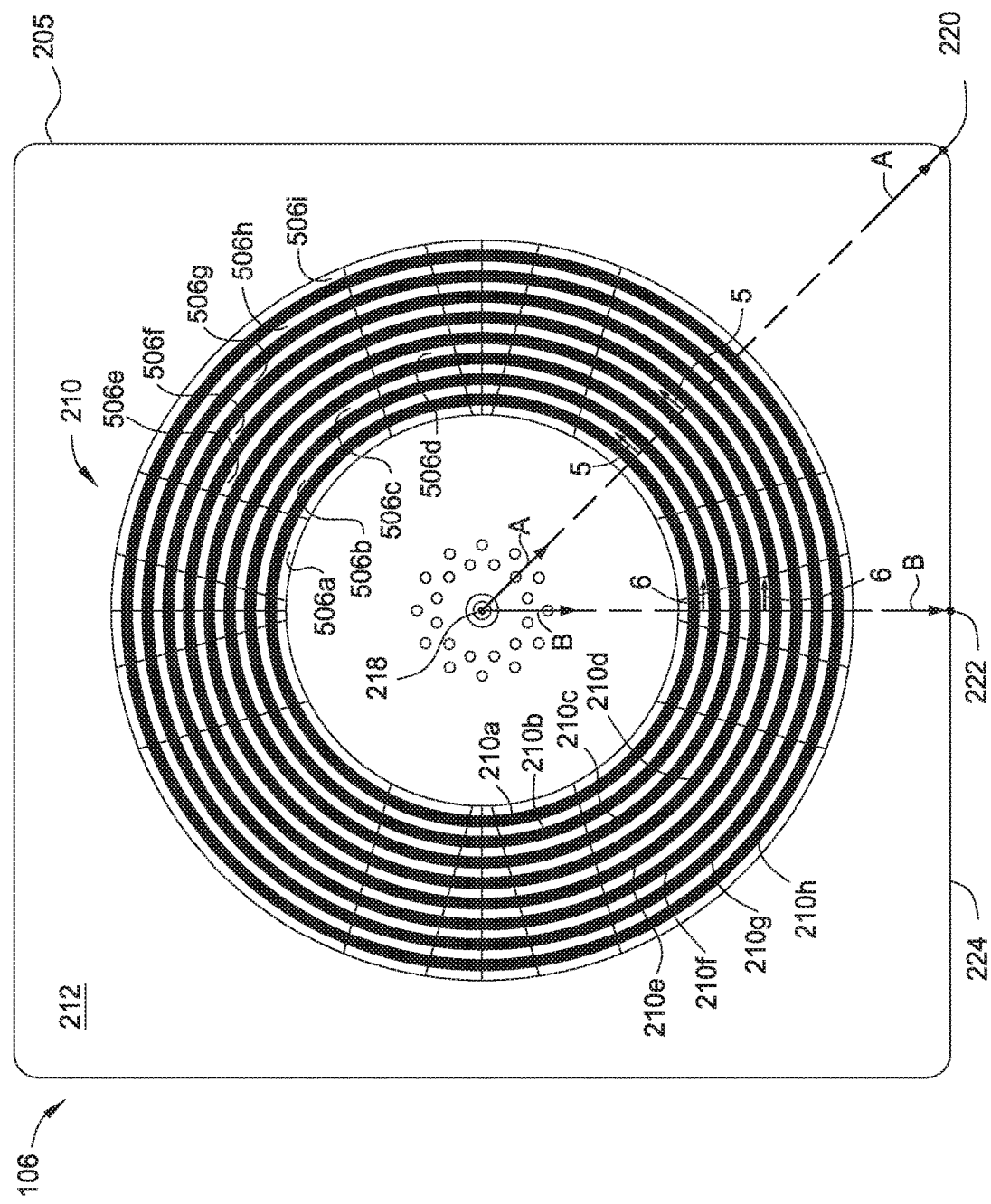
FIG. 4 is a top view of the of the backing plate of FIG. 2 according to implementations described herein.

FIG. 2 is a perspective view of the backing plate 106 showing a plurality of grooves 210 according to implementations described herein. FIG. 3 is an enlarged view of a portion of the backing plate 106 of FIG. 2 according to implementations described herein. FIG. 4 is a top view of the backing plate 106 of FIG. 2 according to implementations described herein. The backing plate 106 comprises a rectangular body 205 having a front surface 212 that opposes a back surface 214. In one implementation, the front surface 212 of the backing plate 106 faces away from the substrate support 130. In another implementation, the front surface 212 of the backing plate 106 faces the substrate support 130. The rectangular body 205 has a first axis 216 perpendicular to a center 218 of the rectangular body 205. In the present example, an RF conductor (not shown) couples the backing plate 106 to the RF power source 122 at the center 218. Although shown as rectangular, other shaped backing plates may benefit from the implementations described herein. For example, in one implementation, the backing plate 106 has a square-shaped body.

The grooves 210 are generally formed in a surface of the backing plate 106 that intersects the RF return path defined across the backing plate 106 such that RF current flowing across the backing plate 106 to the RF power source 122 crosses the grooves 210. For example, the grooves 210 may circumscribe an RF conductive connection between the backing plate 106 and a conductor, coupling the backing plate 106 to the RF power source 122. More specifically, the grooves 210 may circumscribe the RF conductor (not shown) coupling the backing plate 106 to the RF power source 122 at the center 218. Although a plurality of grooves 210 are shown, it is contemplated that a single groove may alternatively be utilized. It is also contemplated that the grooves 210 may be alternatively or additionally formed on other chamber components having surfaces that define a portion of the RF return path.

In the implementation depicted in FIG. 2, the grooves 210 form a pattern of circular grooves in the front surface 212. The grooves 210 may be concentric to each other. The grooves 210 may be concentric to the first axis 216.

The backing plate 106 is made from a metallic material or a metal compound material. The backing plate 106 can be composed of, for example, aluminum, copper, cobalt, nickel, tantalum, titanium, tungsten, and alloys thereof. The backing plate 106 can also be a metal compound, such as, for example, titanium nitride, tantalum nitride, or tungsten nitride. In one implementation, the backing plate 106 is composed of aluminum.

In one implementation, the number of grooves 210 is eight. In other implementations, the number of grooves 210 may be between 2 and 20 (e.g., between 5 and 15; between 7 and 12; between 8 and 10). Those skilled in the art will realize that the number of grooves 210 can vary depending on the specific application.

In one implementation, the plurality of grooves 210 comprise an innermost radial groove 210a and an outermost radial groove 210h, with a plurality of grooves 210b-210g distributed between the innermost radial groove 210a and the outermost radial groove 210h.

In one implementation, the at least one groove 210 is formed in a surface of the RF return path which is not exposed to an interior of the chamber body 103.

As depicted in FIG. 3, the plurality of grooves 210 are defined by a plurality of annular partitions 506a-506i (collectively 506). For example, the innermost radial groove 210a is defined by an innermost annular partition 506a and annular partition 506b. In one implementation, the annular partitions 506 comprise the innermost annular partition 506a and an outermost annular partition 506i, with a plurality of annular partitions 506b-506h distributed between the innermost annular partition 506a and the outermost annular partition 506i.

In the implementation depicted in FIG. 3, the annular partitions 506 form a pattern of circular annular partitions 506 on the front surface 212. The annular partitions 506 may be concentric to each other. The annular partitions 506 may be concentric to the first axis 216.

In one implementation, the number of annular partitions 506 is nine. In other implementations, the number of annular partitions 506 may be between 3 and 21 (e.g., between 6 and 16; between 8 and 13; between 9 and 11). Those skilled in the art will realize that the number of annular partitions 506 can vary depending on the specific application.

FIG. 5 is an enlarged cross-sectional view of a portion of the backing plate 106 taken along line 5-5 of FIG. 4 and RF return path A-A. FIG. 6 is an enlarged cross-sectional view of a portion of the backing plate 106 taken along line 6-6 of FIG. 4 and RF return path B-B. The RF return path A-A is orthogonal to the first axis 216 and extends across the front surface 212 of the rectangular body 205 from the first axis 216 to a corner 220 of the rectangular body 205. The RF return path B-B is orthogonal to the first axis 216 and extends across the front surface 212 of the rectangular body 205 from the first axis 216 to a midpoint 222 of an edge 224 of the rectangular body 205.

Referring to FIG. 5 and FIG. 6, the plurality of grooves 210b-210d (collectively 210) are formed in the front surface 212 of the rectangular body 205. In the implementation of FIG. 5 and FIG. 6, these grooves 210b-210d are uniformly spaced with a pitch P. The pitch P is the radial distance between adjacent grooves. Between each groove is an annular partition 506b-506e (collectively 506) having a width Wp. Each groove of the plurality of grooves 210 includes walls 510, which terminate in a substantially square-shaped base portion 512. The walls 510 may be generally perpendicular and terminate at the square-shaped base portion 512.

The portion of each groove of grooves 210b-210d depicted in FIG. 5 has a depth Dg1 and a width Wg, which define the profile of the groove, such that a length (L1) of the RF return path across the portion of each groove of grooves 210b-210d depicted in FIG. 5 can be expressed 2Dg1+Wg. The portion of each groove of grooves 210b-210d depicted in FIG. 6 has a depth Dg2 and a width Wg, such that a length (L2) of the RF return path across the portion of each groove of grooves 210b-210d depicted in FIG. 6 can be expressed 2Dg+Wg. Thus, by varying the lengths L2 relative to L1, the RF return path distance may be set as chosen to control standing wave effects.

In one example, depth Dg2 is greater than the depth Dg1 by an extended depth Dg3. Thus, the groove depth Dg2 is equal to or substantially equals to the groove depth Dg1 plus the extended groove depth Dg3. The increased depth of the portion of each groove of grooves 210b-210d along RF return path B-B provides an increase in the length or total surface area along RF return path B-B relative to the length or surface area along RF return path B-B when the surface is planar. Thus, the depth Dg2 of the grooves 210 along RF return path B-B is equal to or substantially equals the depth Dg1 plus the extended depth Dg3.

Each groove of grooves 210 may have an inclination causing the groove depth to increase from groove depth Dg1 to groove depth Dg2. The depth of each groove may be tapered or sloped.

In one implementation as shown in FIG. 5 and FIG. 6, the grooves 210 may have a rectangular cross-section. In another implementation (not shown), the grooves 210 may have a U-shaped cross-section.

In one implementation, the width Wg of each groove of the grooves 210 is equal to or substantially equal to the width Wp of the annular partition 506. In one implementation, the width Wg of each groove of the grooves 210 is greater than the width Wp of the annular partition 506. In one implementation, the width Wg of each groove of the groove 210 is less than the width Wp of the annular partition 506.

The grooves 210 should be sized to be wide enough to inhibit arcing across each groove of the grooves 210 between adjacent annular partitions 506.

The backing plate 106 has a thickness T from the front surface 212 to the back surface 214.

It should be noted that a variety of groove widths and/or spacing may be used to achieve the chosen length or surface area of the front surface 212 along each RF return path. Further, a variety of groove depths may be used to achieve the chosen length or surface area of the front surface 212 along each RF return path. A factor being that the length or surface area of the front surface 212 along RF return path A-A ($RF_{A-A}$) be equal to or substantially equal to the length or surface area of the front surface 212 along RF return path B-B ($RF_{B-B}$). Thus, $RF_{A-A}$ plus $\Sigma$ Dg3 is equal to or substantially equal to $RF_{B-B}$. It should also be noted that in some implementations, a difference in the profile of the grooves can be used to account for chamber asymmetries caused by other components of the chamber. For example, chamber asymmetries caused by the presence of the slit valve door.

In another implementation, the grooves 210 are disposed in the front surface 212 of the backing plate 106. However, these grooves 210 are not uniformly spaced. Rather, the front surface is partitioned into regions in which the grooves are spaced apart with different pitches. In addition, the grooves do not necessarily have a uniform depth.

The grooves 210 may be formed in the front surface 212 of the backing plate 106 by cutting, milling or other suitable method. For example, an end mill may be used to cut grooves in the front surface 212 of the backing plate 106. Alternatively, grooves may be formed by embossing or pressing the front surface with a hydraulic or pneumatic press. The relatively simple groove pattern avoids expensive machining. In addition, the grooves may be formed by preparing the backing plate in a mold. For example, the backing plate 106 may be cast from a mold of the backing plate 106, which contains a negative image of the grooves 210.

As discussed above the presence of the grooves with varying depth or width allows for the length or surface area along a first RF return path to be equal to or substantially equal to the length or surface area of the backing plate 106 along a second RF return path. Consequently, the backing plate design described herein reduces the corner effect caused by the rectangular shape of the backing plate thus compensating for the standing wave spatial oscillation within the processing chamber.

The term "substantially equal" generally indicates within ±0.1%, 0.5%, 1%, 2%, 5%, or up to ±10% of the indicated value.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

What is claimed is:

1. A backing plate for a plasma processing chamber, comprising:
    a rectangular body having:
    a front surface;
    a back surface opposing the front surface; a first axis perpendicular to a center of the rectangular body; and
    a plurality of circular grooves formed in the front surface, concentric to the first axis and spaced apart from each other;
    a first RF return path orthogonal to the first axis and extending across the front surface of the rectangular body from the first axis across the plurality of circular grooves to a corner of the rectangular body; and
    a second RF return path orthogonal to the first axis and extending across the front surface of the rectangular body from the first axis across the plurality of circular grooves to a midpoint of an edge of the rectangular body; and
    wherein each groove of the plurality of circular grooves has a first groove profile defined along the first RF return path by a first depth and a first width and a second groove profile defined along the second RF return path by a second depth and the first width, wherein the second depth is greater than the first depth, and
    wherein the second groove profile is larger than the first groove profile such that a first length of the front surface defined along the first RF return path across the plurality of circular grooves is equal to or substantially equal to a second length defined along the second RF return path.

2. The backing plate of claim 1, wherein the first length defined by the first RF return path includes the first groove profile of each groove.

3. The backing plate of claim 2, wherein the second length defined by the second RF return path includes the second groove profile of each groove.

4. The backing plate of claim 1, wherein the plurality of circular grooves comprises from about 2 to about 20 grooves.

5. The backing plate of claim 4, wherein the plurality of circular grooves comprise eight grooves.

6. The backing plate of claim 1, wherein the backing plate is composed of aluminum.

7. The backing plate of claim 1, wherein the grooves of the plurality of circular grooves are uniformly spaced with a pitch P and the pitch P is a radial distance between adjacent grooves.

8. The backing plate of claim 1, further comprising an annular partition having a width Wp between adjacent grooves.

9. The backing plate of claim 1, wherein each groove of the plurality of circular grooves has an inclination causing a depth of the groove to increase from the first depth to the second depth.

10. A plasma processing chamber, comprising:
a chamber body defining a process volume; a substrate support disposed in the process volume;
a radio frequency (RF) power source operable to provide power to generate a plasma within the process volume; and
a backing plate positioned over the processing volume and comprising:
a rectangular body having:
a front surface;
a back surface opposing the front surface; a first axis perpendicular to a center of the rectangular body; and
a plurality of circular grooves formed in the front surface, concentric to the first axis and spaced apart from each other;
a first RF return path orthogonal to the first axis and extending across the front surface of the rectangular body from the first axis across the plurality of circular grooves to a corner of the rectangular body; and
a second RF return path orthogonal to the first axis and extending across the front surface of the rectangular body from the first axis across the plurality of circular grooves to a midpoint of an edge of the rectangular body; and
wherein each groove of the plurality of circular grooves has a first groove profile defined along the first RF return path by a first depth and a first width and a second groove profile defined along the second RF return path by a second depth and the first width, wherein the second depth is greater than the first depth, and
wherein the second groove profile is larger than the first groove profile such that a first length of the front surface defined along the first RF return path is equal to or substantially equal to a second length defined along the second RF return path.

11. The plasma processing chamber of claim 10, wherein the back surface of the backing plate faces the process volume.

12. The plasma processing chamber of claim 10, further comprising a diffuser coupled with the backing plate.

13. The plasma processing chamber of claim 12, wherein the RF power source is coupled to the backing plate and/or the diffuser.

14. The plasma processing chamber of claim 10, wherein the first length defined by the first RF return path includes the first groove profile of each groove.

15. The plasma processing chamber of claim 14, wherein the second length defined by the second RF return path includes the second groove profile of each groove.

16. The plasma processing chamber of claim 10, wherein the plurality of circular grooves comprises from about 2 to about 20 grooves.

17. The plasma processing chamber of claim 10, wherein the backing plate is composed of aluminum.

18. The plasma processing chamber of claim 10, wherein the grooves of the plurality of circular grooves are uniformly spaced with a pitch P and the pitch P is a radial distance between adjacent grooves.

19. The plasma processing chamber of claim 10, further comprising an annular partition having a width Wp between adjacent grooves.

20. The plasma processing chamber of claim 10, wherein each groove of the plurality of circular grooves has an inclination causing a depth of the groove to increase from the first depth to the second depth.

* * * * *